US009577115B2

(12) United States Patent
Cho et al.

(10) Patent No.: US 9,577,115 B2
(45) Date of Patent: Feb. 21, 2017

(54) SEMICONDUCTOR DEVICES HAVING AIR GAPS

(75) Inventors: Byung-Kyu Cho, Seoul (KR);
Chang-Hyun Lee, Suwon-si (KR);
Young-Woo Park, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 45 days.

(21) Appl. No.: 13/195,347

(22) Filed: Aug. 1, 2011

(65) Prior Publication Data

US 2012/0037975 A1    Feb. 16, 2012

(30) Foreign Application Priority Data

Aug. 11, 2010 (KR) .................. 10-2010-0077472

(51) Int. Cl.
| | |
|---|---|
| *H01L 21/70* | (2006.01) |
| *H01L 29/788* | (2006.01) |
| *H01L 21/764* | (2006.01) |
| *H01L 27/115* | (2006.01) |
| *H01L 29/423* | (2006.01) |

(52) U.S. Cl.
CPC ........ *H01L 29/7881* (2013.01); *H01L 21/764* (2013.01); *H01L 27/11521* (2013.01); *H01L 29/42336* (2013.01)

(58) Field of Classification Search
CPC ............. H01L 27/11521; H01L 27/115; H01L 21/764; H01L 27/11524; H01L 21/28273; H01L 21/76229; H01L 29/66825; H01L 29/42324; H01L 29/7881; H01L 21/76224

USPC ................ 257/410, 522, E21.564, E21.573, 257/E21.581, 501, 506, 510

See application file for complete search history.

(56) References Cited

U.S. PATENT DOCUMENTS

| | | | | |
|---|---|---|---|---|
| 6,060,740 | A * | 5/2000 | Shimizu ............ | H01L 27/11521 257/314 |
| 6,469,339 | B1 * | 10/2002 | Onakado et al. ............. | 257/315 |
| 2006/0001073 | A1 * | 1/2006 | Chen et al. ................... | 257/314 |
| 2006/0231884 | A1 * | 10/2006 | Yonemochi ....... | H01L 21/28273 257/314 |
| 2006/0246684 | A1 * | 11/2006 | Hoshi et al. .................. | 438/427 |
| 2007/0026633 | A1 * | 2/2007 | Lee ............................... | 438/424 |
| 2007/0045769 | A1 * | 3/2007 | Bian et al. .................... | 257/510 |
| 2007/0053223 | A1 * | 3/2007 | Choi ................ | H01L 21/28273 365/185.05 |
| 2007/0111441 | A1 * | 5/2007 | Koh ..................... | H01L 27/115 438/257 |

(Continued)

FOREIGN PATENT DOCUMENTS

| | | |
|---|---|---|
| JP | 2008-021768 | 1/2008 |
| KR | 10-0833434 | 5/2008 |
| KR | 1020090081637 | 7/2009 |

*Primary Examiner* — David Chen
(74) *Attorney, Agent, or Firm* — Muir Patent Law, PLLC

(57) ABSTRACT

A semiconductor device has an isolation layer pattern, a plurality of gate structures, and a first insulation layer pattern. The isolation layer pattern is formed on a substrate and has a recess thereon. The gate structures are spaced apart from each other on the substrate and the isolation layer pattern. The first insulation layer pattern is formed on the substrate and covers the gate structures and an inner wall of the recess. The first insulation layer pattern has a first air gap therein.

19 Claims, 11 Drawing Sheets

(56) References Cited

U.S. PATENT DOCUMENTS

| | | | |
|---|---|---|---|
| 2007/0184615 A1* | 8/2007 | Brazzelli | H01L 21/764 438/266 |
| 2007/0184616 A1* | 8/2007 | Yoo | H01L 27/11521 438/266 |
| 2007/0267681 A1* | 11/2007 | Joo | H01L 21/28273 257/315 |
| 2008/0237685 A1* | 10/2008 | Cho | H01L 21/28273 257/316 |
| 2008/0277713 A1* | 11/2008 | Maekawa | 257/316 |
| 2009/0212352 A1* | 8/2009 | Aoyama | H01L 21/28273 257/324 |
| 2010/0019311 A1* | 1/2010 | Sato | H01L 21/28273 257/326 |
| 2010/0200905 A1* | 8/2010 | Huang et al. | 257/324 |
| 2010/0230741 A1* | 9/2010 | Choi | H01L 21/76229 257/324 |

* cited by examiner

1ST DIRECTION
⊗⟶ 2ND DIRECTION

1ST DIRECTION
⊗⟶ 2ND DIRECTION

1ST DIRECTION
⊗⟶ 2ND DIRECTION

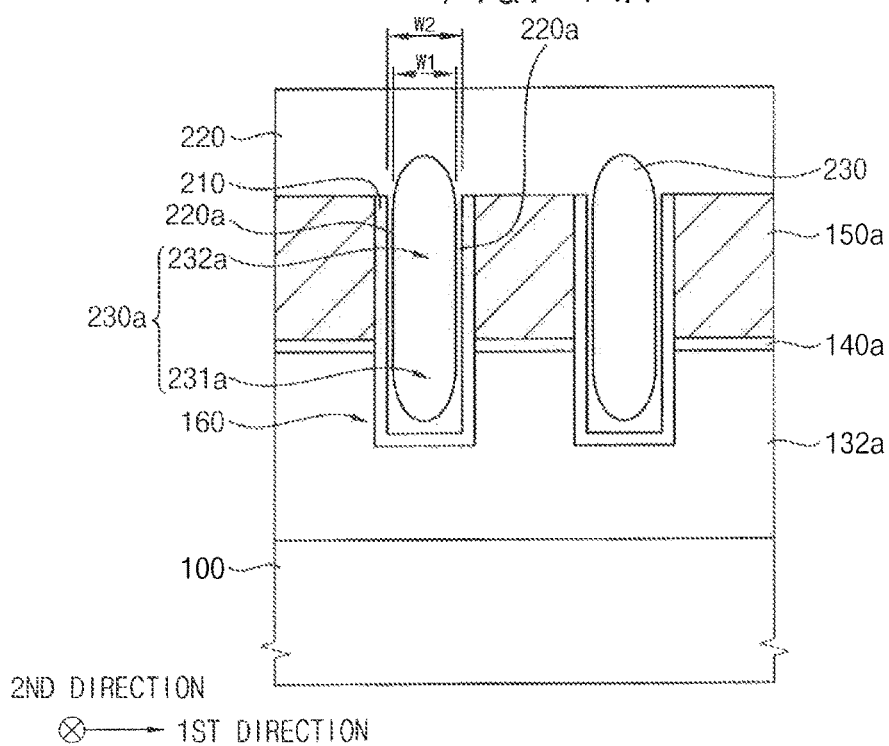
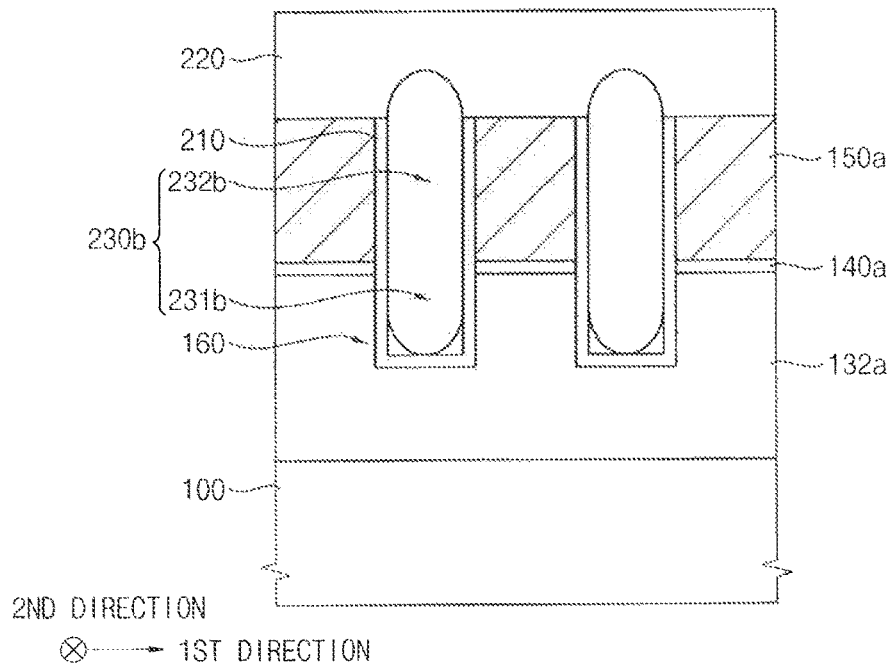

SEMICONDUCTOR DEVICES HAVING AIR GAPS

CROSS-REFERENCE TO RELATED APPLICATIONS

This application claims priority under 35 USC §119 from Korean Patent Application No. 10-2010-0077472 filed on Aug. 11, 2010 in the Korean Intellectual Property Office (KIPO), the contents of which are herein incorporated by reference in their entirety.

BACKGROUND OF THE INVENTION

1. Field of the General Inventive Concept

Example embodiments relate to semiconductor devices and methods of manufacturing semiconductor devices. More particularly, example embodiments relate to semiconductor devices having air gaps and methods of manufacturing semiconductor devices having air gaps.

2. Description of the Related Art

As semiconductor devices have been highly integrated, a threshold voltage may be changed due to the parasitic capacitance between floating gates. Thus, a method of manufacturing a semiconductor device in which the parasitic capacitance may be reduced is needed, and a method of forming an air gap between word lines has been developed. However, a method of forming an air gap effectively at a desired position to address these and other problems has not been developed.

SUMMARY

Example embodiments provide a semiconductor device including air gaps at desired positions.

Example embodiments provide a method of manufacturing a semiconductor device including air gaps at desired positions.

Additional features and utilities of the present general inventive concept will be set forth in part in the description which follows and, in park, will be obvious from the description, or may be learned by practice of the general inventive concept.

Embodiments of the present general inventive concept may be achieved by providing a semiconductor device. The semiconductor device may have an isolation layer pattern, a plurality of gate structures, and a first insulation layer pattern. The isolation layer pattern may be formed on a substrate and has a recess thereon. The gate structures may be spaced apart from each other on the substrate and the isolation layer pattern. The first insulation layer pattern may be formed on the substrate and covers the gate structures and an inner wall of the recess. The first insulation layer pattern has a first air gap therein.

Embodiments of the present general inventive concept may also be achieved by providing a semiconductor device, including a substrate, a plurality of isolation layer patterns disposed within the substrate, a plurality of floating gates adjacent the isolation layer patterns, a control gate above the floating gates, a first insulation layer disposed above the control gate, a plurality of recesses between the control gates and the isolation layer patterns, and a plurality of air gaps formed within the recesses to penetrate the substrate, the isolation layer patterns, the control gate and the first insulation layer.

The plurality of recesses may have bottom surfaces lower than that of the floating gates.

The air gaps may have a bottom surface lower than that of the floating gates.

The semiconductor device may further include a second insulation layer pattern on sidewalls of the floating gates and control gate, the inner wall of the recess and the substrate. The first insulation layer pattern may be formed on the second insulation layer pattern.

The first insulation pattern may be disposed between the second insulation pattern and the air gap.

The semiconductor device may further include second air gaps formed within the second insulation layer pattern.

The second insulation layer pattern may be flush with the air gaps such that the air gaps fill the entire recesses.

The air gaps may have a lower portion disposed in the recess and an upper portion adjacent to sidewalls of the gate structures.

Embodiments of the present general inventive concept may also be achieved by providing a semiconductor device. The semiconductor device may have a plurality of isolation layer patterns, a plurality of gate structures, and a first insulation layer pattern. The isolation layer patterns may be on a substrate, and each of the isolation layer patterns extends in a first direction and having a recess thereon. The gate structures may be spaced apart from each other in the first direction on the substrate. Each of the gate structures may extend in a second direction substantially perpendicular to the first direction. The first insulation layer pattern may be formed on the substrate and covers the gate structures and inner walls of the recesses. The first insulation layer pattern may have a first air gap therein.

The recess may have a width in the first direction substantially the same as a distance between the gate structures in the first direction.

The first air gap may include lower portions in the recess and an upper portion adjacent to sidewalls of the gate structures. The lower portions may have an island shape and the upper portion may have a linear shape extending in the second direction.

The semiconductor device may further include a second insulation layer pattern on sidewalls of the gate structures, the inner walls of the recesses and the substrate. The first insulation layer pattern may be formed on the second insulation layer pattern.

The second insulation layer pattern may fill the recess to have a second air gap therein.

The first insulation pattern may be disposed between the second insulation pattern and the air gap.

The semiconductor device may further include a second air gap formed within the second insulation layer pattern under the first air gap.

Each gate structure may include a tunnel insulation layer pattern, a floating gate, a dielectric layer pattern and a control gate sequentially stacked on the substrate. The tunnel insulation layer patterns and the floating gates may have an island shape. Each of the dielectric layer pattern and the control gate may be formed on the floating gates and the isolation layer patterns and may extend in the second direction.

Embodiments of the present general inventive concept may also be achieved by providing a method of manufacturing a semiconductor device. In the method, a plurality of gate structures spaced apart from each other in a second direction may be formed on a substrate on which an isolation layer pattern is formed. Each of the gate structures may extend in a first direction substantially perpendicular to the second direction. An upper portion of the isolation layer pattern between the gate structures may be removed to form a recess. A first insulation layer pattern having a first air gap therein may be formed on sidewalls of the gate structures, an inner wall of the recess and the substrate.

The recess may have a bottom lower than that of the gate structures.

A second insulation layer pattern may be formed on sidewalls of the gate structures, the inner walls of the recesses and the substrate, wherein the first insulation layer pattern is formed on the second insulation layer pattern.

The first insulation pattern may be formed between the second insulation pattern and the air gap.

The foregoing and/or other aspects and utilities of the present general inventive concept may also be achieved by providing a method of manufacturing a semiconductor device in which upper portions of isolation layer patterns between gate structures may be etched to form recesses, and a first insulation layer pattern may be formed on the recesses and surfaces of the gate structures. A second insulation layer pattern covering the resultant structure may be formed, and a second air gap may be formed between the gate structures and in the recesses. Thus, the channel coupling between cell gates may be reduced so that the semiconductor device may have improved programming characteristics. The air gap may be formed deeper than the conventional air gap in a vertical direction in which word lines may protrude, and thus the channel coupling may be much reduced.

BRIEF DESCRIPTION OF THE DRAWINGS

Example embodiments will be more clearly understood from the following detailed description taken in conjunction with the accompanying drawings. FIGS. 1 to 14 represent non-limiting, example embodiments as described herein.

Figure 1:
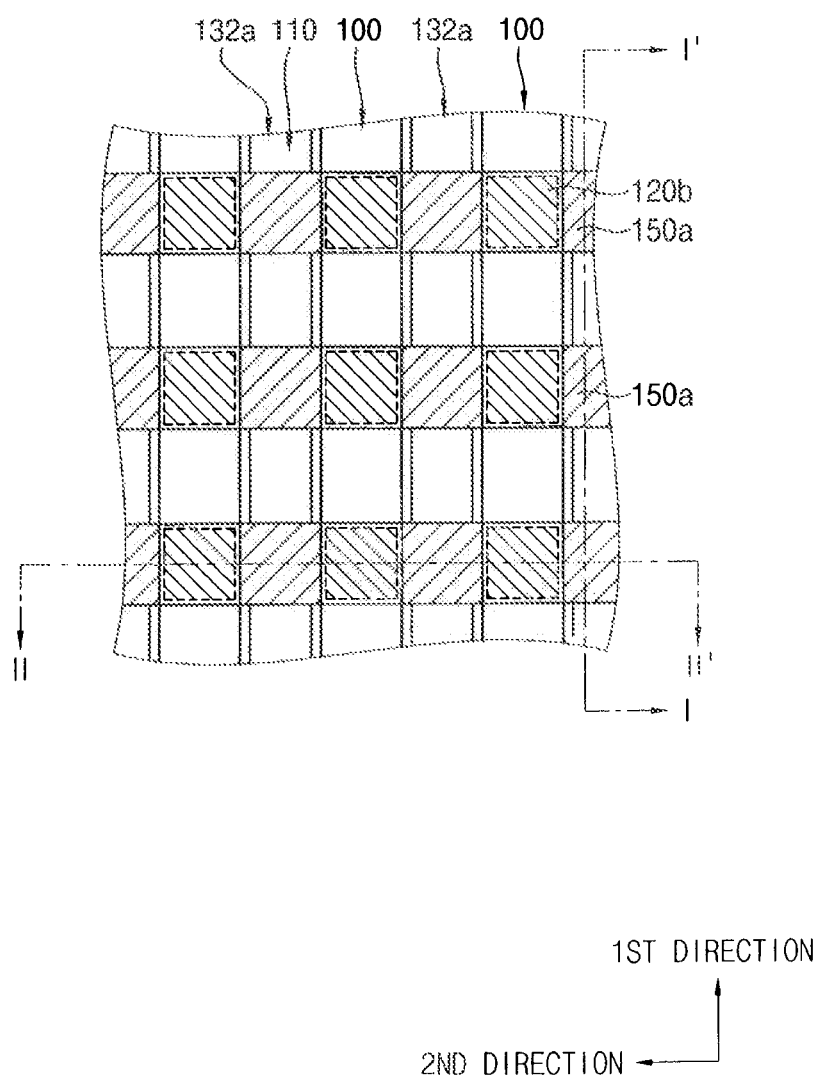
Figure 2:
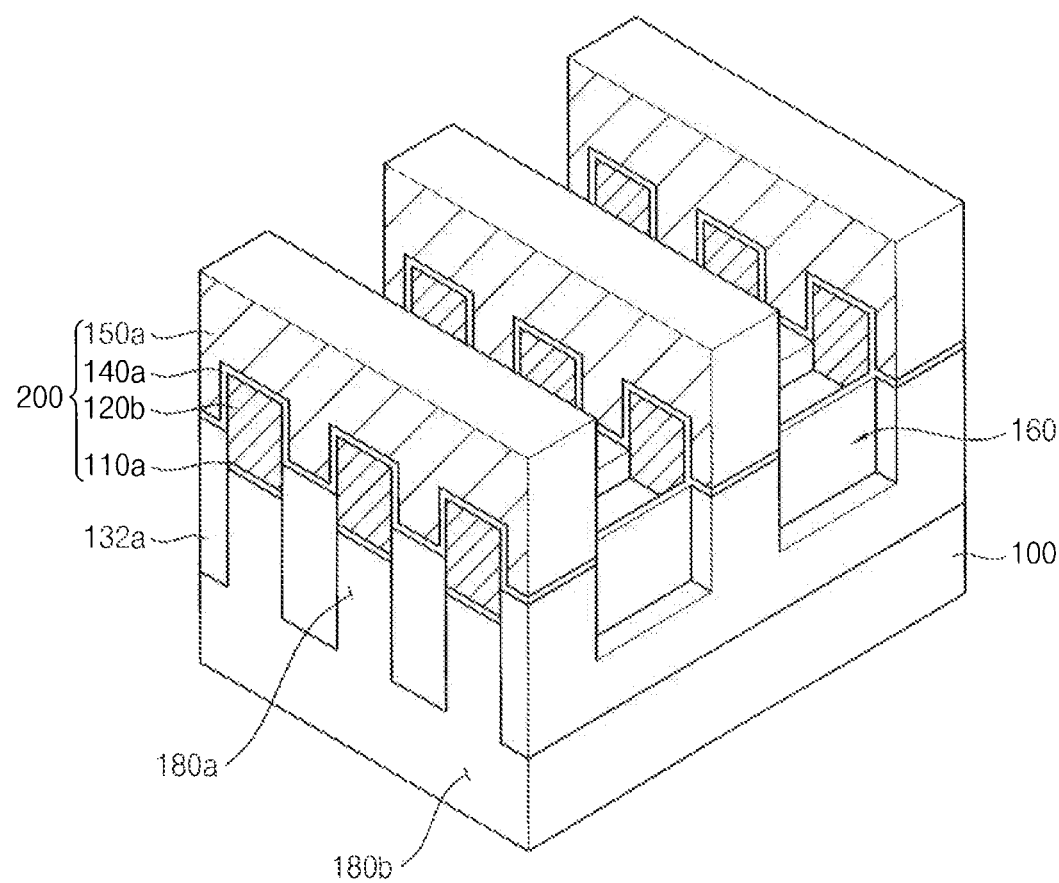
Figure 2:
Figure 3A:
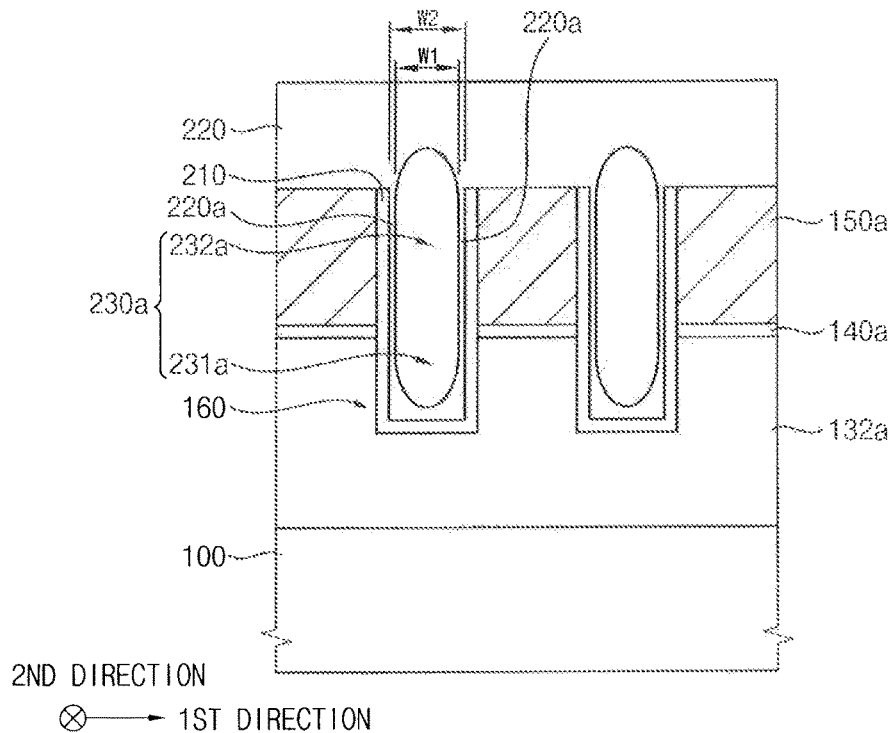
Figure 3B:
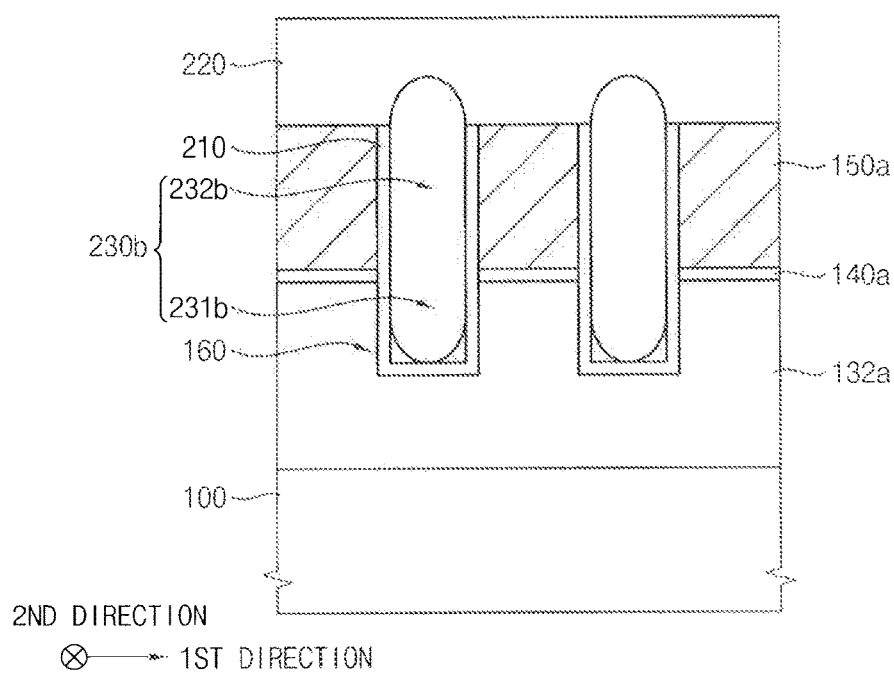
Figure 3C:
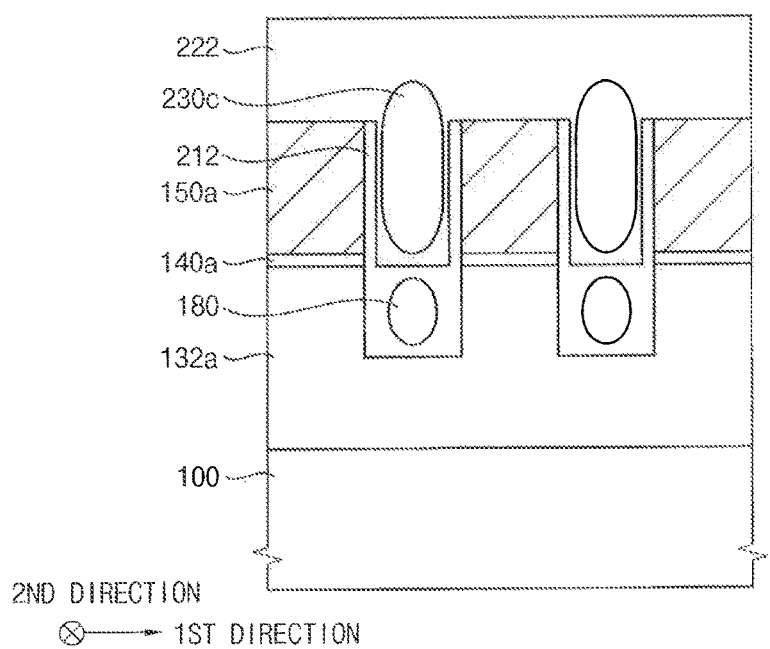

These and/or other features and utilities of the present general inventive concept will become apparent and more readily appreciated from the following description of the embodiments, taken in conjunction with the accompanying drawings of which:

FIG. 1 is a plan view illustrating a semiconductor device in accordance with example embodiments;

FIG. 2 is a perspective view of the semiconductor device cut along the lines I-I' and II-II' of FIG. 1;

FIGS. 3A to 3C are cross-sectional views of the semiconductor device of FIG. 2 further including first and second insulation layers thereon; and FIGS. 4 to 14 are cross-sectional views illustrating a method of manufacturing the semiconductor device of FIGS. 1 to 3.

DETAILED DESCRIPTION OF THE PREFERRED EMBODIMENTS

Various example embodiments will be described more fully hereinafter with reference to the accompanying drawings, in which some example embodiments are illustrated. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

Reference will now be made in detail to the embodiments of the present general inventive concept, examples of which are illustrated in the accompanying drawings, wherein like reference numerals refer to the like elements throughout.

The embodiments are described below in order to explain the present general inventive concept while referring to the figures.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another, element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a plan view illustrating a semiconductor device in accordance with example embodiments. FIG. 2 is a perspective view of the semiconductor device cut along the lines I-I' and II-II' of FIG. 1, FIGS. 3A to 3C are cross-sectional views of the semiconductor device of FIG. 2 further including first and second insulation layers thereon. FIGS. 3A to 3C are cross-sectional views cut along the line II-II' of FIG. 2.

Referring to FIGS. 1, 2 and 3A, the semiconductor device may include a plurality of gate structures 200 spaced apart from each other in a first direction on a substrate 100 on which a plurality of isolation layer patterns 132a are formed. Each of the gate structures 200 may extend in a second direction substantially perpendicular to the first direction. A recess 160 may be formed on an upper portion of each isolation layer pattern 132a between the gate structures 200. The semiconductor device may further include a first insulation layer pattern 210 on sidewalls of the gate structures 200, top surfaces of the substrate 100 between the gate structures 200, and the recess 160. The semiconductor device may further include a second insulation layer pattern 220 covering the gate structures 200 and having a first air gap 230a therein extending in the second direction.

The isolation layer patterns 132a may define an active region and a field region. The active region may include an upper active region 180a between the isolation layer patterns 132a, and a lower active region 180h beneath the upper active region. The substrate 100 may include single crystalline silicon. Each isolation layer pattern 132a may have a linear or bar shape extending in the first direction. The isolation layer patterns 132a may be spaced apart from each other in the second direction at a given distance. Thus, the active region and the field region may be defined alternately and repeatedly in the second direction.

In example embodiments, the recess 160 may have a bottom lower than a tunnel insulation layer pattern 110a of each gate structure 200. In example embodiments, the recess 160 may have a width substantially the same as that between the sidewalls of the gate structures 200. In an example embodiment, the recess 160 may have a substantially vertical sidewall.

Each gate structure 200 may have the tunnel insulation layer pattern 110a, a floating gate 120b, a dielectric layer pattern 140a and a control gate 150a.

The tunnel insulation layer pattern 110a may be formed on the active region of the substrate 100, and may include a thermal oxide that may be formed by a heat treatment on a top surface of the substrate 100.

The floating gate 120b may include polysilicon doped with n-type impurities. In an example embodiment, the floating gate 120b may be doped with phosphorus or arsenic.

The floating gates 120b together with the tunnel insulation layer patterns 110a may have an island shape on the active region, and may store charges substantially. The floating gate 120b may have a width substantially the same as that of the tunnel insulation layer pattern 110a. The floating gate 120b may also have the same width as the upper active region 180a positioned between the isolation layer patterns 132a.

The dielectric layer pattern 140a may be formed on surfaces of the isolation layer patterns 132a and the floating gates 120b, and may extend in the second direction. The dielectric layer pattern 140a may include a metal oxide having a high dielectric constant. Alternatively, the dielectric layer pattern 140a may have a multi-layered structure, e.g., an oxide/nitride/oxide structure.

The control gate 150a may be formed on the dielectric layer pattern 140a, and may include polysilicon doped with n-type impurities. The control gate 150a may extend in the second direction.

Source/drain regions (not illustrated) may be further formed at upper portions 180a of the active regions of the substrate 100 adjacent to the floating gates 120b.

The first insulation layer pattern 210 may cover sidewalls of the tunnel insulation layer patterns 110a, the floating gates 120b, the dielectric layer patterns 140a and the control gates 150a. The first insulation layer pattern 210 may be further formed on the recess 160.

The second insulation layer pattern 220 may have a first air gap 230a therein.

In example embodiments, the first air gap 230a may have a top surface higher than that of the gate structures 200. The first air gap 230a may have a bottom lower than that of the gate structures 200. The first air gap 230a may have a lower portion in the recess 160 and an upper portion adjacent to the sidewalls of the control gates 150a. In an example embodiment, the lower portions of the first air gap 230a may have an island shape, and the upper portion of the first air gap 230a may have a linear shape extending in the second direction.

The first air gap 230a may be formed between the gate structures 200, and thus channel coupling between cell gates may be reduced so that the semiconductor device may have improved programming characteristics. The channel coupling means that when a programming voltage is applied, the channel potential between the programmed cell and an adjacent cell may decrease because of the interference therebetween so that the threshold voltage of the cell may increase. The first air gap 230a may be formed in the recess 160 on the upper portion of the isolation layer patterns 132a, so that the first air gap 230a may be formed deeper than the conventional air gap in a vertical direction in which word lines may protrude. Thus, the channel coupling of the semiconductor device in accordance with example embodiments may be reduced.

The semiconductor device of FIG. 3B is different from that of FIG. 3A in an aspect of the structure of the second insulation layer pattern.

Referring to FIG. 3B, the second insulation layer pattern 220 may be formed on the first insulation layer pattern 210 and the control gate 150a, and may have a second air gap 230b therein. The second insulation layer pattern 220 may cover the gate structures 200 and a portion of the first insulation layer pattern 210, and thus the boundary of the second air gap 230b may be defined by the first and second insulation layer patterns 210 and 220.

Thus, as illustrated in FIG. 3B, the second air gap 230b may substantially fill the recess 160 such that lateral edges of the second air gap 230b are flush with side surfaces of the first insulation pattern 210. The width of the second air gaps 230b may be varied in order to optimize the electrical characteristics of the memory device.

Referring to FIG. 3A, a width W1 of the first air gap 230a may be controlled by forming a predetermined amount of insulation material 220a between the air gap 230a and the sidewalls of the first insulation pattern 210. Thus, the first air gap 230a may be formed to have a width W1 that is smaller than a width W2 of the recess 160 when lined with the first insulation pattern 210.

The semiconductor device of FIG. 3C is different from those of FIGS. 3A and 3B in an aspect of the structures of the insulation layer patterns.

Referring to FIG. 3O, a third insulation layer pattern 212 may fill the recess 160 on the isolation layer patterns 132a and may have a third air gap 180 therein. The third insulation layer pattern 212 may cover sidewalls of the tunnel insulation layer patterns 110a, the floating gates 120b, the dielectric layer pattern 140a and the control gate 150a, and may partially fill the recess 160 in a manner to take up all the recess space below the control gate 150a and within the isolation pattern 132a that is not taken up by the third air gap 180.

A fourth insulation layer pattern 222 may be formed on the third insulation layer pattern 212 and the control gate 150a, and may have a fourth air gap 230c therein.

FIGS. 4 to 14 are cross-sectional views illustrating a method of manufacturing the semiconductor device of FIGS. 1 to 3. FIGS. 4 to 10 are cross-sectional views cut along the line II-II' of FIG. 1, and FIGS. 11 to 14 are cross-sectional views cut along the line I-I' of FIG. 1.

Figure 4:
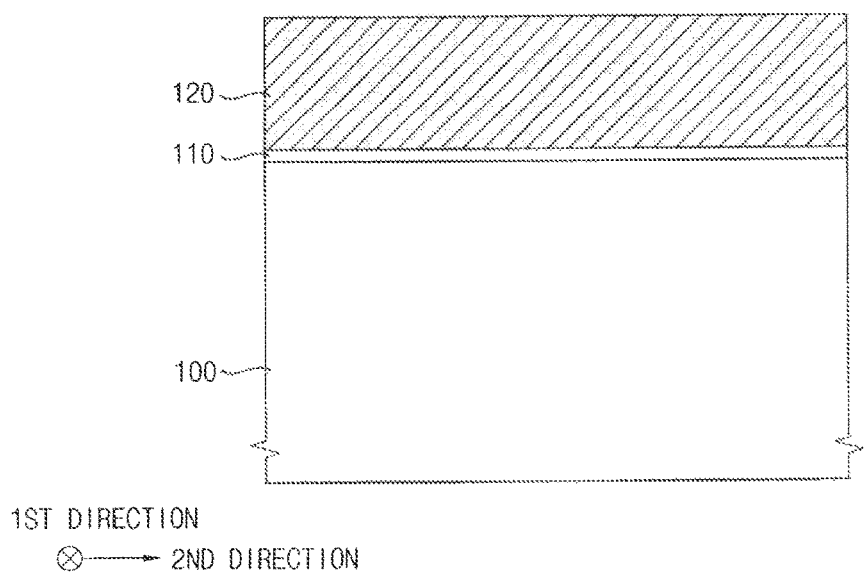

Referring to FIG. 4, a tunnel insulation layer 110 may be formed on a substrate 100.

The substrate 100 may be a semiconductor substrate, e.g., a silicon substrate, a germanium substrate or a silicon-germanium substrate, a silicon-on-insulator (SOI) substrate, a germanium-on-insulator (GOI) substrate, etc. The substrate 100 may further include a well region (not illustrated) doped with p-type or n-type impurities.

The tunnel insulation layer 110 may be formed using an oxide such as silicon oxide, a nitride such as silicon nitride, silicon oxide doped with impurities, or a low-k dielectric material.

A floating gate layer 120 may be formed on the tunnel insulation layer 110.

The floating gate layer 120 may be formed using doped polysilicon, a metal having a high work function, e.g., tungsten, titanium, cobalt, nickel, etc. In an example embodiment, the floating gate layer 120 may be formed by depositing a polysilicon layer on the tunnel insulation layer 110 through a low pressure chemical vapor deposition (LPCVD) process and by doping n-type impurities into the polysilicon layer.

Figure 5:
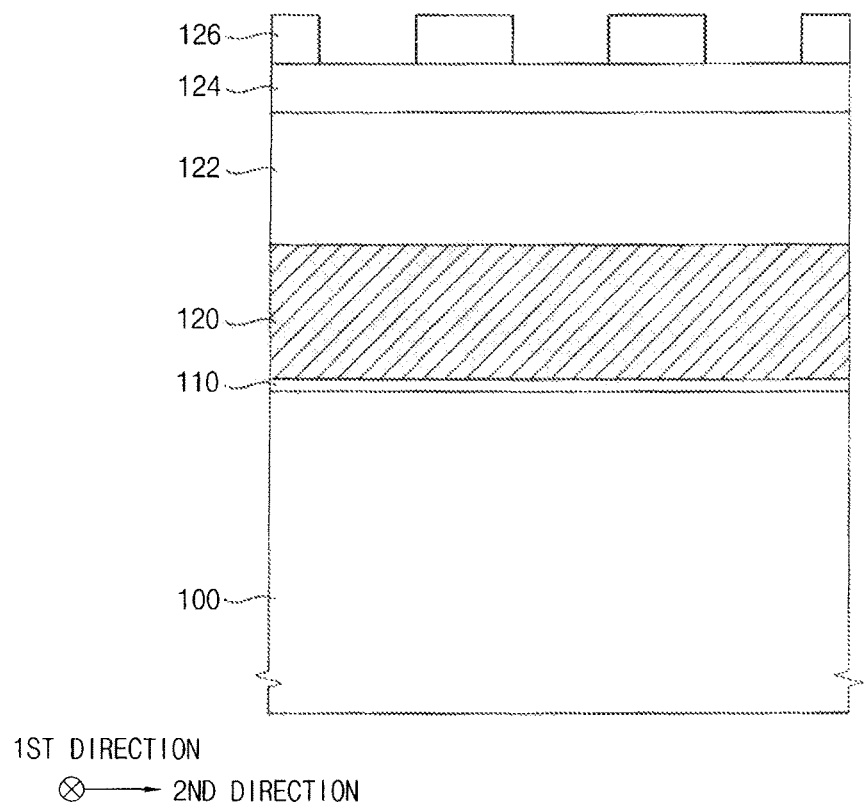

Referring to FIG. 5, a first hard mask layer 122 may be formed on the floating gate layer 120. The first hard mask layer 122 may be formed by depositing silicon oxide through a chemical vapor deposition (CVD) process.

An anti-reflection layer 124 may be formed on the first hard mask layer 122.

A photoresist pattern 126 may be formed on the anti-reflection layer 124.

Figure 6:
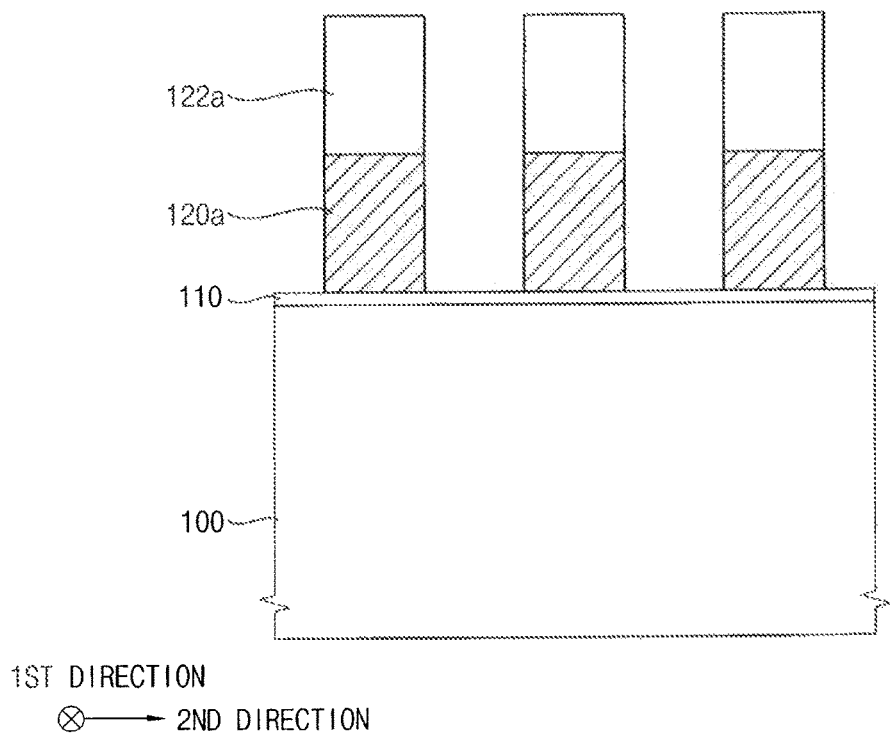

Referring to FIG. 6, the anti-reflection layer 124 and the first hard mask layer 122 may be sequentially etched using the photoresist pattern 126 as an etching mask to form an anti-reflection pattern (not illustrated) and a first hard mask 122a, respectively. The photoresist pattern 126 and the anti-reflection pattern may be removed by an ashing process and/or a stripping process.

The floating gate layer 120 may be anisotropically etched using the first hard mask 122a as an etching mask to form a plurality of preliminary floating gates 120a. Each preliminary floating gate 120a may be formed to extend in a first direction.

Figure 7:
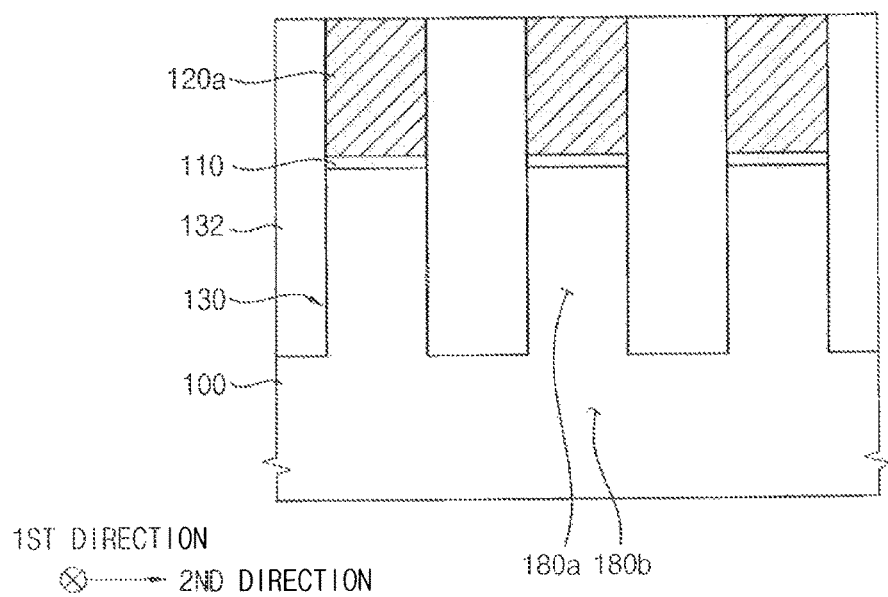

Referring to FIG. 7, the tunnel insulation layer 110 and upper portions of the substrate 100 may be sequentially etched using the first hard mask pattern 122a as an etching mask to form trenches 130. The trenches 130 may be formed to be spaced apart from each other in a second direction substantially perpendicular to the first direction, and each trench 130 may be formed to extend in the first direction.

An insulation layer may be formed to fill the trenches 130. In example embodiments, the insulation layer may be formed by a CVD process, a plasma enhanced chemical vapor deposition (PECVD) process, a high-density plasma chemical vapor deposition (HDP-CVD) process or an atomic layer deposition (ALD) process. The insulation layer may be formed using silicon oxide, e.g., borophospho silicate glass (BPSG), undoped silicate glass (USG), spin on glass (SOG), phosphor silicate glass (PSG), flowable oxide (FOX), tetraethyl oxide silicate (TEOS), plasma enhanced tetraethyl ortho silicate (PE-TEOS), high-density plasma chemical vapor deposition (HDP-CVD) oxide, etc. These may be used alone or in a combination thereof.

An upper portion of the insulation layer may be planarized until a top surface of the first hard mask 122a is exposed to form isolation layers 132 filling the trenches 130. The substrate 100 may be divided into an active region and a field region by the isolation layers 132. That is, a region of the substrate 100 on which the isolation layers 132 are formed may be defined as the field region, and a region of the substrate 100 on which the isolation layers 132 are not formed may be defined as the active region. The active region may also be separated into an upper active region 180a adjacent the tunnel oxide layer 110, and a lower active region 180b beneath the upper active region 180a.

The first hard mask 122a may be removed.

Figure 8:
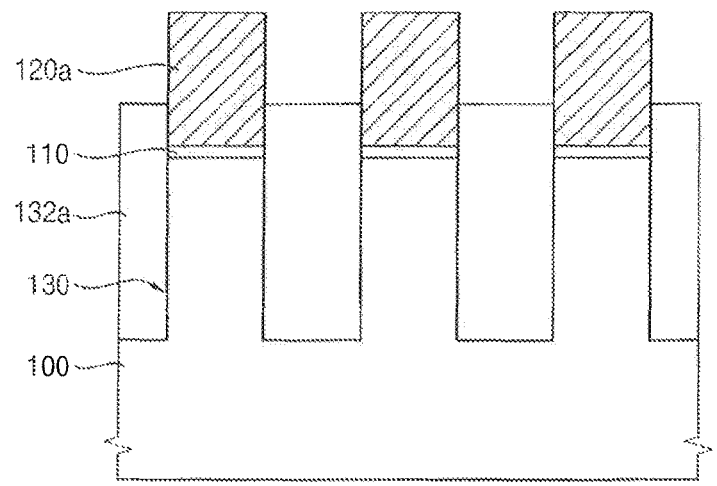

Referring to FIG. 8, upper portions of the isolation layers 132 may be removed until upper portions of the preliminary floating gates 120a are exposed, thereby forming isolation layer patterns 132a. In example embodiments, the isolation layer patterns 132a may have a top surface higher than that of the tunnel insulation layer 110.

Figure 9:
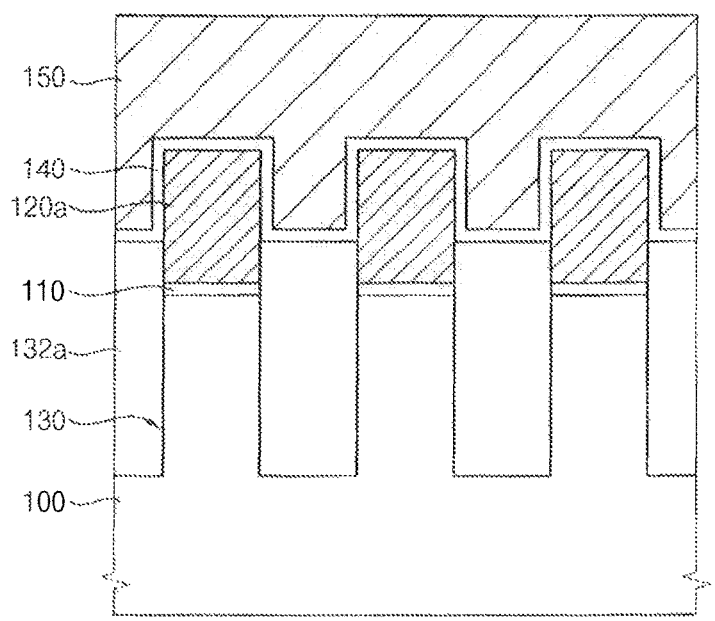

Referring to FIG. 9, a dielectric layer 140 may be formed on the preliminary floating gates 120a and the isolation layer patterns 132a.

The dielectric layer 140 may be formed using an oxide or a nitride, and for example, may have a multi-layered structure of oxide/nitride/oxide (ONO). Alternatively, the dielectric layer 140 may be formed using a metal oxide having a high dielectric constant, so that the semiconductor device may have a high capacitance and improved leakage current characteristics. The high-k metal oxide may include hafnium oxide, titanium oxide, tantalum oxide, zirconium oxide, aluminum oxide, etc.

A control gate layer 150 may be formed on the dielectric layer 140. The control gate layer 150 may be formed using doped polysilicon, a metal, a metal nitride, a metal silicide, etc. In example embodiments, the control gate layer 150 may be formed by depositing polysilicon doped with n-type impurities. After forming the doped polysilicon layer, a planarization process on a top surface of the doped polysilicon layer may be further performed.

Figure 10:
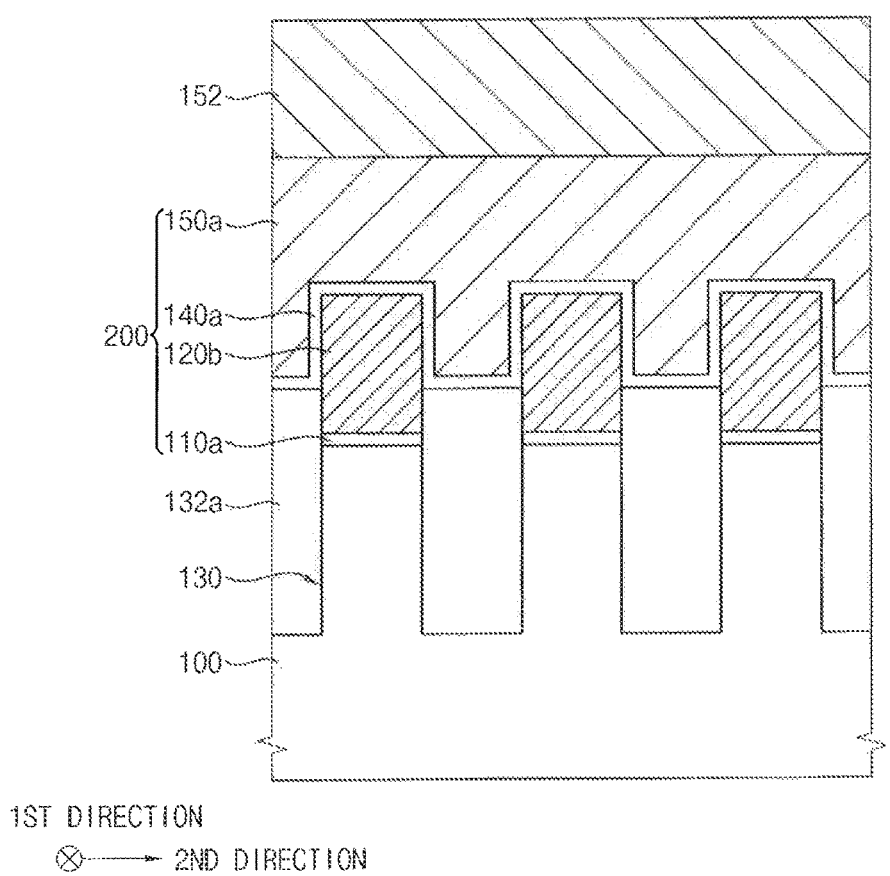
Figure 11:
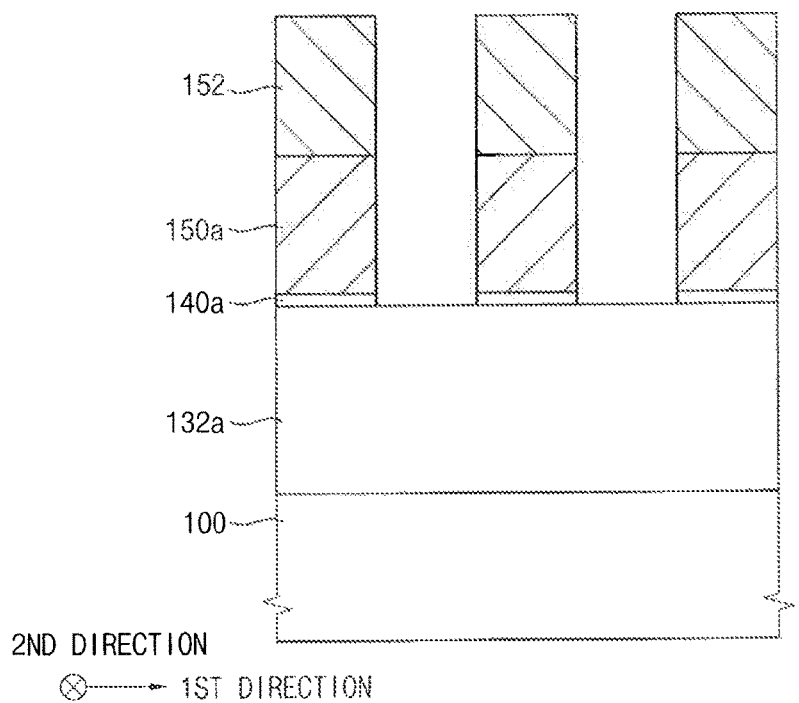

Referring to FIGS. 10 and 11, a second hard mask 152 may be formed on the control gate layer 150. The second hard mask 152 may be formed by depositing a silicon nitride layer and by patterning the silicon nitride layer. The second hard mask 152 may be formed to extend in the second direction.

The control gate layer 150 may be anisotropically etched using the second hard mask 152 as an etching mask to form a plurality of control gates 150a. The dielectric layer 140, the preliminary floating gate 120a and the tunnel insulation layer 110 may be etched to form a plurality of dielectric layer patterns 140a, a plurality of floating gates 120b and a plurality of tunnel insulation layer patterns 110a, respectively. Thus, a plurality of gate structures 200 each of which may include the tunnel insulation layer pattern 110, the floating gate 120b and the dielectric layer pattern 140a sequentially stacked on the substrate 100 may be formed.

The gate structures 200 may be formed in a cell region and/or a peripheral circuit region. In an example embodiment, 16 or 32 gate structures 200 may be formed in the cell region.

In example embodiments, the floating gates 120b and the tunnel insulation layer patterns 1105 may be formed to have an island shape, respectively, on the active region of the substrate 100. Each dielectric layer pattern 140a and each control gate 150a may extend in the second direction, and may be sequentially formed on the floating gates 120b and the isolation layer patterns 132a.

Alternatively, the tunnel insulation layer patterns 110a may not have an island shape, but extend in the first direction on the active region of the substrate 100. A portion of the tunnel insulation layer pattern 110a that is not covered by the floating gate 120b may have a thickness smaller than that of a portion of the tunnel insulation layer pattern 110a that is covered by the floating gate 120b. The portion of the tunnel insulation layer pattern 110a that is not covered by the floating gate 120b may not be completely removed but partially removed so that the substrate 100 may be prevented from being damaged during the patterning process.

Figure 12A:
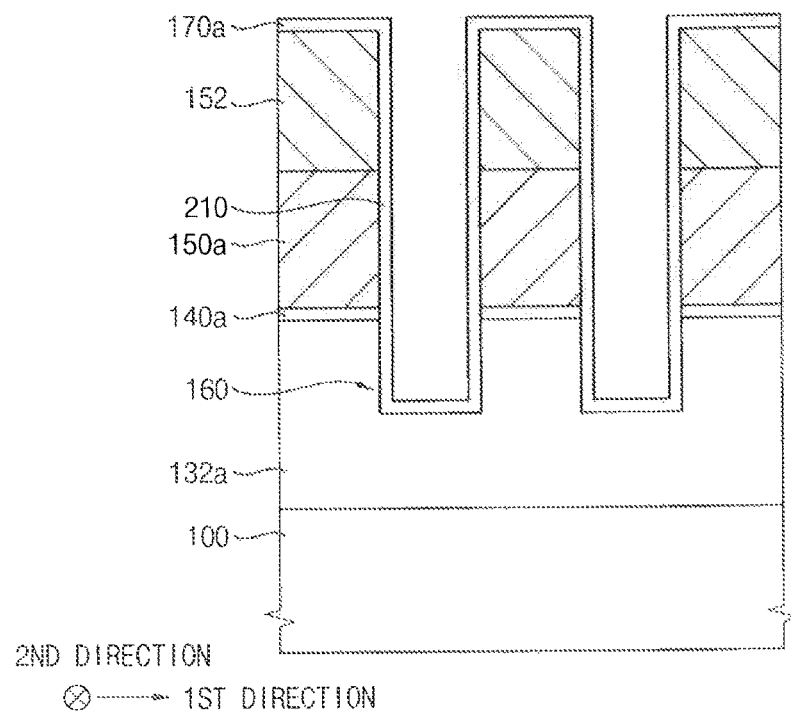

Referring to FIG. 12A, the anisotropic etching process may be continued to form a recess 160 at an upper portion of each isolation layer pattern 132a.

In example embodiments, the recess 160 may be formed to have a bottom lower than the tunnel insulation layer pattern 110a. In example embodiments, the recess 160 may be formed to have a width substantially the same as that between the gate structures 200. In an example embodiment, the recess 160 may have a substantially vertical sidewall.

Impurities may be implanted into upper portions of the substrate 100 adjacent to the floating gates 120b to form impurity regions (not illustrated). The impurity regions may serve as source/drain regions.

A first insulation layer 170a may be formed on sidewalls of the gate structures 200, the second hard mask 152, the isolation layer patterns 132a and the substrate 100. In example embodiments, the first insulation layer 170a may be formed on inner walls of the recesses 160.

The first insulation layer 170a may be formed using silicon oxide, silicon nitride, silicon oxynitride, etc., by a CVD process, an ALD process, a physical vapor deposition (PVD) process, etc. In an example embodiment, the first insulation layer 170a may be formed using high temperature oxide (HTO) or middle temperature oxide (MTO) to have a thickness of about 50 Å.

Figure 12B:
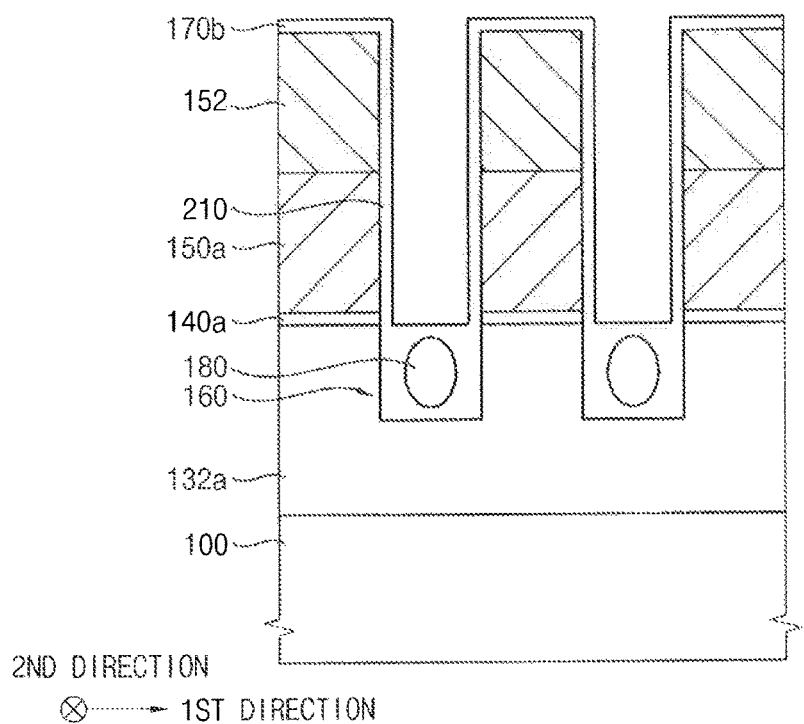

Alternatively, referring to FIG. 12B, a second insulation layer 170b may be formed to fill the recess 160 and have a third air gap 180 in the recess 160. That is, the second insulation layer 170b may be formed on the sidewalls of the gate structures 200 and surfaces of the second hard masks 152 and may have the third air gap 180 in the recess 160. The method of forming the third air gap 180 in the second insulation layer 170b is a practice known to those skilled in the art, and is thus not described herein in detail.

Accordingly, as the first insulation layer 170b having the third aft gap 180 is formed, as illustrated in FIG. 3B, in a deposition process of a second insulation layer pattern 222 covering the first insulation layer 170b, a fourth air gap 230c may be formed in the second insulation layer 222.

Hereinafter, only the case in which the first insulation layer 170a not having the third air gap 180 is formed will be illustrated.

Figure 13:
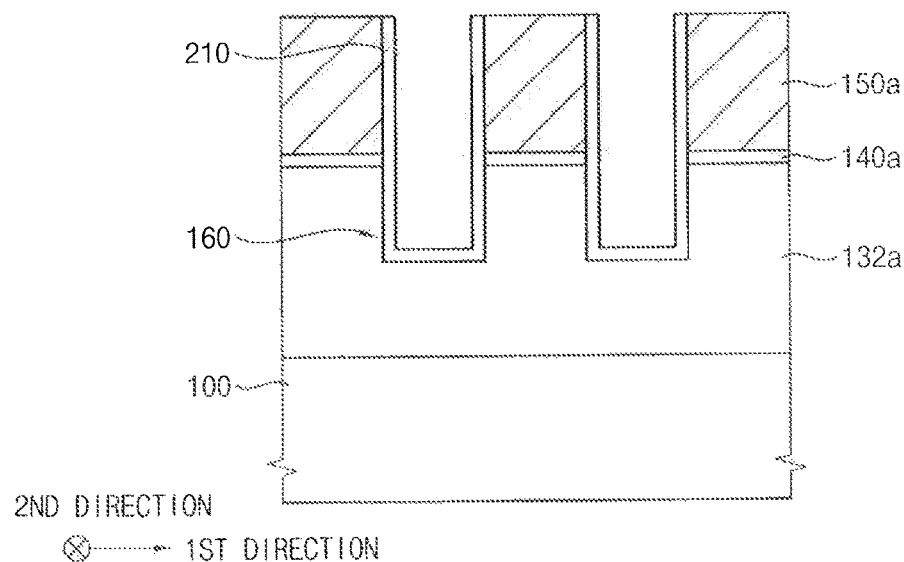

Referring to FIG. 13, a sacrificial layer (not illustrated) may be formed on the first insulation layer 170a to fill spaces between the gate structures 200.

The sacrificial layer may be formed by a CVD process, an ALD process, a PVD process, etc. In example embodiments, the sacrificial layer may be formed using carbon-based spin-on-hardmask (C-SOH) or silicon-based spin-on-hardmask (Si—SOH).

Upper portions of the sacrificial layer and the first insulation layer 170a may be removed to form a sacrificial layer pattern and a first insulation layer pattern 210, respectively. The second hard mask 152 may be also removed to expose a top surface of the control gate 150a.

In example embodiments, the upper portion of the sacrificial layer may be removed by a dry etching process, and the upper portion of the first insulation layer 170a may be removed by an etch back process.

The sacrificial layer pattern may be removed. In example embodiments, the sacrificial layer pattern may be removed by an ashing process.

Referring to FIG. 14A, a second insulation layer may be formed on the substrate 100 to cover the gate structures 200 and the first insulation layer pattern 210. The second insulation layer may not completely fill the spaces between the gate structures 200. Thus, a first air gap 230a may be formed between the gate structures 200. The first air gap 230a may be formed to have a bottom lower than that of the gate structures 200. In example embodiments, the first air gap 230a may be formed to extend in the second direction, and thus may be referred to as a first air tunnel. The method of forming the first air gap 230a in the second insulation layer is a practice known to those skilled in the art, and is thus not described herein in detail.

The second insulation layer may be partially removed to form a second insulation layer pattern 220 covering the gate structures 200 and exposing top surfaces of the substrate 100 between the gate structures 200.

The second insulation layer may be formed using a silicon oxide such as PEOX or MTO by a CVD process, a PECVD process or an LPCVD process. The second insulation layer pattern 220 may be formed under a process condition in which the second insulation layer pattern 220 may have low step coverage so that the first air gap 230a may be formed.

During the formation of the first air gap 230a, in order to make the width thereof smaller, and thus optimize the programming characteristics of the semiconductor device, portions 220a of the second insulation layer may be formed at lateral edge portions of the first insulation layer pattern 210 and in the bottom of the recess 160. This may be done in order to vary the width of the air gap 230a to optimize the electrical characteristics of the device in relation to other factors such as gate width, isolation layer pattern width, substrate material, gate material, etc. Thus, the first air gap 230a may be formed to have a width $W_1$ that is smaller than a width $W_2$ of the recess 160 when lined with the first insulation pattern 210.

In example embodiments, the first air gap 230a may be formed to have a top surface higher than that of the gate structures 200.

In example embodiments, the first air gap 230a may be formed to have a lower portion 231a in the recess 160 and an upper portion 232a adjacent to the sidewalls of the control gates 150a. In an example embodiment, the lower portions 231a of the first air gap 230a may have an island shape, and the upper portion 232a of the first air gap 230a may have a linear shape extending in the second direction.

In example embodiments, the first air gap 230a may be defined only by the second insulation layer pattern 220. That is, the second insulation layer pattern 220 may cover not only the gate structures 200 but also the first insulation layer pattern 210, so that the boundary of the first air gap 230a may be defined only by the second insulation layer pattern 220.

Alternatively, referring to FIG. 14B, a second air gap 230b defined by both of the first and second insulation layer patterns 210 and 220 may be formed. The width of the second air gap 230b may be formed to be flush with side portions of the first insulation layer pattern 210. The method of forming the second air gap 230b between the first and second insulation layer patterns 210 and 220 is a practice known to those skilled in the art, and is thus not described herein in detail. By varying the width of the second air gap 230b in this manner, electrical characteristics of the memory device may be altered based on various design parameters of the device. That is, the second insulation layer pattern 220 may be formed to cover the gate structures 200 and a portion of the first insulation layer pattern 210, and the boundary of the second air gap 230b may be defined by both of the first and second insulation layer patterns 210 and 220. In example embodiments, the second air gap 230b may be formed to extend in the second direction, and thus may be referred to as a second air tunnel. The second air gap 230b may have a lower portion 231b and an upper portion 232b.

An insulating interlayer (not illustrated) may be further formed on the substrate 100 to cover the second insulation layer pattern 220. The insulating interlayer may be formed using an oxide. A bit line contact (not illustrated) may be formed through the insulating interlayer, and a bit line (not illustrated) may be formed to be electrically connected to the bit line contact.

By the above-illustrated processes, the semiconductor device in accordance with example embodiments may be manufactured.

According to example embodiments, in the method of manufacturing the semiconductor device, upper portions of isolation layer patterns between gate structures may be etched to form recesses, and a first insulation layer pattern may be formed on the recesses and surfaces of the gate structures. A second insulation layer pattern covering the resultant structure may be formed, and a second air gap may be formed between the gate structures and in the recesses. Thus, the channel coupling between cell gates may be reduced so that the semiconductor device may have improved programming characteristics. The air gap may be formed deeper than the conventional air gap in a vertical direction in which word lines may protrude, and thus the channel coupling may be much reduced.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A semiconductor device comprising:
a plurality of isolation layer patterns spaced apart from each other in a second direction on a substrate, each of the isolation layer patterns extending in a first direction crossing the second direction and having a plurality of recesses extending therein from a top surface, each of said plurality of recesses being surrounded by a respective isolation layer pattern with a bottom of the recess being defined by a surface of the respective isolation layer pattern, said plurality of recesses being spaced apart from each other in the first direction thereon;
a plurality of gate structures spaced apart from each other in the first direction on the substrate and the isolation layer patterns, each of the gate structures extending in the second direction; and
an insulation layer pattern structure on the substrate, the isolation layer patterns and the gate structures, the insulation layer pattern structure having a plurality of air gaps spaced apart from each other in the first direction therein, each one of the plurality of air gaps extending in the second direction between the plurality of gate structures and having upper and lower portions, the lower portions of the air gaps being in the plurality of recesses that extend below said plurality of gate structures and below the top surfaces of said plurality of isolation layer patterns,
wherein bottom surfaces of the air gaps are lower than a top surface of said substrate.

2. The semiconductor device of claim 1, wherein the lower portions of each of the air gaps are in communication with the upper portions thereof.

3. The semiconductor device of claim 1, wherein the lower portions of each of the air gaps are spaced apart from the upper portions thereof.

4. The semiconductor device of claim 1, wherein the insulation layer pattern structure includes first and second insulation layer patterns.

5. The semiconductor device of claim 4, wherein the first insulation layer pattern covers a sidewall of each of the gate structures, an inner wall of each of the recesses, and a bottom surface of the substrate, and wherein the second insulation layer pattern is formed on the gate structures and the first insulation layer pattern.

6. The semiconductor device of claim 5, wherein the air gaps are formed in the second insulation layer pattern.

7. The semiconductor device of claim 5, wherein the air gaps are defined by both of the first and second insulation layer patterns so that the first insulation layer pattern is exposed by at least one of the air gaps.

8. The semiconductor device of claim 5, wherein the upper portions of each of the air gaps are formed in the second insulation layer pattern, and the lower portions of each of the air gaps are formed in the first insulation layer pattern.

9. The semiconductor device of claim 5, wherein a top surface of the first insulation layer pattern is substantially coplanar with top surfaces of the gate structures.

10. The semiconductor device of claim 1, wherein top surfaces of the air gaps are rounded and higher than top surfaces of the gate structures.

11. The semiconductor device of claim 1, wherein the top surfaces of the isolation layer patterns are higher than the top surface of the substrate.

12. The semiconductor device of claim 1, wherein each of the gate structures includes a plurality of tunnel insulation layer patterns, a plurality of floating gates, a dielectric layer pattern and a control gate sequentially stacked, and wherein the plurality of tunnel insulation layer patterns are spaced apart from each other in the second direction, the plurality of floating gates are spaced apart from each other in the second direction, and each of the dielectric layer pattern and the control gate extends in the second direction.

13. The semiconductor device of claim 1, wherein the first and second directions are substantially perpendicular to each other.

14. A semiconductor device comprising:
a substrate having a plurality of active regions defined by a plurality of isolation layer patterns thereon, the active regions and the isolation layer patterns extending in a first direction and being disposed alternately and repeatedly in a second direction substantially perpendicular to the first direction, each isolation layer pattern having a plurality of recesses formed therein, and each of said plurality of recesses being surrounded by a respective isolation layer pattern with a bottom of the recess being defined by a layer surface of the respective isolation layer pattern;

a plurality of gate structures disposed in the first direction on the active regions of the substrate and the isolation layer patterns, each of the gate structures extending in the second direction; and a first insulation layer pattern structure on the active regions of the substrate, the isolation layer patterns and the gate structures, the first insulation layer pattern structure having a plurality of first air gap columns between neighboring ones of the gate structures, respectively, and each of the first air gap columns including a plurality of first air gap portions located within the recesses formed in the isolation layer patterns, respectively, wherein said plurality of first air gap portions are at a depth below the gate structures, below the upper surfaces of the isolation layer patterns, and below a top surface of the substrate.

15. The semiconductor device of claim 14, further comprising a plurality of second air gap columns between neighboring ones of the gate structures, respectively, and each of the second air gap columns including a plurality of second air gap portions located within the recesses formed in the isolation layer patterns, respectively, wherein said plurality of second air gap portions extending above the gate structures and into a bottom surface of a second insulation layer pattern structure.

16. The semiconductor device of claim 15, wherein each of the second air gap portions extends in the second direction and is in communication with the first air gap portions of a corresponding one of the first air gap columns.

17. The semiconductor device of claim 15, wherein each of the second air gap portions extends in the second direction and is not connected to the first air gap portions of a corresponding one of the first air gap columns.

18. The semiconductor device of claim 15, wherein each of the gate structures includes a plurality of tunnel insulation layer patterns, a plurality of floating gates, a dielectric layer pattern and a control gate sequentially stacked, and wherein a top surface of each of the second air gap portions is rounded and higher than a top surface of the control gate.

19. The semiconductor device of claim 18, wherein the first insulation layer pattern structure covering at least a sidewall of each of the gate structures, and the second insulation layer pattern structure being formed on the first insulation layer pattern structure and the gate structures.

* * * * *